United States Patent [19]
Hou

[11] Patent Number: 5,983,997
[45] Date of Patent: *Nov. 16, 1999

[54] COLD PLATE HAVING UNIFORM PRESSURE DROP AND UNIFORM FLOW RATE

[75] Inventor: Kai Hou, Chino Hill, Calif.

[73] Assignee: Brazonics, Inc., Hampton Falls, N.H.

[ * ] Notice: This patent issued on a continued prosecution application filed under 37 CFR 1.53(d), and is subject to the twenty year patent term provisions of 35 U.S.C. 154(a)(2).

[21] Appl. No.: 08/733,615

[22] Filed: Oct. 17, 1996

[51] Int. Cl.$^6$ .................................................... F28F 9/26
[52] U.S. Cl. ................... 165/144; 165/80.4; 165/80.3; 257/722; 361/694
[58] Field of Search ................... 165/80.4, 80.3, 165/144, 145, 185; 361/699, 694, 693, 690; 257/722, 721, 714

[56] References Cited

U.S. PATENT DOCUMENTS

| | | | |
|---|---|---|---|
| 2,822,151 | 2/1958 | Heuer et al. | 165/144 |
| 3,134,430 | 5/1964 | Heyn | 165/145 |
| 3,233,664 | 2/1966 | Jacobs | 165/145 |
| 3,327,776 | 6/1967 | Butt | 165/80.4 |
| 3,776,308 | 12/1973 | Simmons | 165/80.4 X |

(List continued on next page.)

FOREIGN PATENT DOCUMENTS

| | | |
|---|---|---|
| 0587971 | 12/1959 | Canada ................... 165/80.4 |
| 0097782A2 | 1/1984 | European Pat. Off. . |
| 0151546B1 | 8/1985 | European Pat. Off. . |
| 0237864A2 | 9/1987 | European Pat. Off. . |
| 0447835A2 | 9/1991 | European Pat. Off. . |
| 0450832A1 | 10/1991 | European Pat. Off. . |
| 0234021B1 | 12/1991 | European Pat. Off. . |
| 0563993A2 | 10/1993 | European Pat. Off. . |
| 0369115B1 | 3/1995 | European Pat. Off. . |
| 0376478B1 | 8/1995 | European Pat. Off. . |
| 2 681 757 A1 | 3/1993 | France . |
| 63-290396 | 11/1988 | Japan . |
| 08116189 | 7/1996 | Japan . |
| 2 289 376 | 11/1995 | United Kingdom . |

OTHER PUBLICATIONS

IBM Technical Disclosure Bulletin, vol. 20, No. 2, Jul. 1986, pp. 689–690.
IBM Technical Disclosure Bulletin, vol. 20, No. 6, Nov. 1977, D. Balderes et al., pp. 2327–2328.
IBM Technical Disclosure Bulletin, vo. 26, No. 7A, Dec. 1983, J.L. Horvath et al.
"Cold Plate with Slits for Compliance to Thermal Conduction Module Hat," *IBM Technical Disclosure Bulletin*, vol. 28, No. 7, pp. 3227–3228, Dec. 1985.
"High–Performance Localized Cooling Cold Plate," *IBM Technical Disclosure Bulletin*, vol. 35, No. 2, pp. 362–363, Jul. 1992.

*Primary Examiner*—Christopher Atkinson
*Attorney, Agent, or Firm*—Testa, Hurwitz & Thibeault, LLP

[57] ABSTRACT

A system for cooling electronic components includes a cold plate having a channel through which a fluid coolant is transported, a plurality of bosses each receiving an electronic, optical, or other heat-generating component, and a plurality of fin structures, at least three of which are adjacently disposed in a sequential order on the cold plate. Each fin structure contacts a boss, and has a fin inlet and a fin outlet in fluid communication with a section of the channel for supplying the area around the boss with coolant and cooling the component seated on the boss. A portion of the channel defines a serpentine path for transporting the fluid coolant to the at least three sequential fin structures in a non-sequential order. Sections of the channel in the serpentine path further transport the coolant in opposite directions, thus enhancing heat transfer and temperature equilibration across the cold plate. The system can further include a plurality of such cooling plates disposed in a vertical stack, and a manifold delivering coolant to the cooling plates. When the cooling plates are stacked, the flow rate and pressure drop across each plate is substantially uniform, thus providing a cold plate having a substantially isothermal surface across a portion of the cold plate.

20 Claims, 7 Drawing Sheets

U.S. PATENT DOCUMENTS

| | | | |
|---|---|---|---|
| 3,921,201 | 11/1975 | Eisele et al. | 357/82 |
| 3,965,971 | 6/1976 | Roggenkamp | 165/39 |
| 4,010,489 | 3/1977 | Bourbeau et al. | 357/82 |
| 4,072,188 | 2/1978 | Wilson et al. | 165/80.4 |
| 4,196,775 | 4/1980 | Groh | 165/68 |
| 4,245,273 | 1/1981 | Feinberg et al. | 361/382 |
| 4,258,383 | 3/1981 | Kessler, Jr. | 357/82 |
| 4,415,025 | 11/1983 | Horvath | 165/185 |
| 4,420,739 | 12/1983 | Herren | 338/53 |
| 4,431,980 | 2/1984 | Ikegawa et al. | 361/699 X |
| 4,448,240 | 5/1984 | Sharon | 165/80 |
| 4,462,462 | 7/1984 | Meagher et al. | 165/80 |
| 4,479,140 | 10/1984 | Horvath | 357/81 |
| 4,493,010 | 1/1985 | Morrison et al. | 361/385 |
| 4,498,530 | 2/1985 | Lipschutz | 165/185 |
| 4,520,384 | 5/1985 | Klein | 357/82 |
| 4,521,170 | 6/1985 | Klein | 357/81 |
| 4,578,745 | 3/1986 | Olsson | 363/68 |
| 4,593,529 | 6/1986 | Birochik | 62/3 |
| 4,614,227 | 9/1986 | Vogel | 165/80.4 |
| 4,694,378 | 9/1987 | Nakayama et al. | 361/385 |
| 4,740,866 | 4/1988 | Kajiwara et al. | 361/382 |
| 4,771,366 | 9/1988 | Blake et al. | 361/387 |
| 4,873,613 | 10/1989 | Iversen | 361/699 |
| 4,884,168 | 11/1989 | August et al. | 257/722 X |
| 4,893,590 | 1/1990 | Kashimura et al. | 123/41.31 |
| 4,938,280 | 7/1990 | Clark | 165/80.4 |
| 5,005,638 | 4/1991 | Goth et al. | 165/80.4 |
| 5,006,924 | 4/1991 | Frankeny et al. | 165/80.4 X |
| 5,021,924 | 6/1991 | Kieda et al. | 361/385 |
| 5,040,381 | 8/1991 | Hazen | 62/3.2 |
| 5,043,797 | 8/1991 | Lopes | 357/82 |
| 5,050,036 | 9/1991 | Oudick et al. | 361/385 |
| 5,130,768 | 7/1992 | Wu et al. | 357/82 |
| 5,144,531 | 9/1992 | Go et al. | 361/382 |
| 5,181,167 | 1/1993 | Davidson et al. | 361/385 |
| 5,349,498 | 9/1994 | Tanzer et al. | 361/689 |
| 5,373,417 | 12/1994 | Barrett | 361/699 |
| 5,380,956 | 1/1995 | Loo et al. | 174/252 |
| 5,455,458 | 10/1995 | Quon et al. | 257/714 |
| 5,526,231 | 6/1996 | Arz et al. | 361/699 X |

COLD PLATE HAVING UNIFORM PRESSURE DROP AND UNIFORM FLOW RATE

FIELD OF THE INVENTION

This invention relates to a cold plate for cooling electronic components to ensure that the components operate efficiently without interruption in service. In particular, this invention relates to a cold plate providing a substantially uniform pressure drop and flow rate when it operates in parallel with an array of cold plates.

BACKGROUND OF THE INVENTION

The electronic industry is constantly challenged by the task of creating a system to dissipate effectively heat generated by electronic components during operation. Electronic components in use typically generate significant heat, which unless cooled, can result in damage to the components themselves as well as damage to adjacent components. Where the components are part of an intricate electronic system such as a cellular phone station or a aircraft control system, such damage can result in operating problems and/or system malfunction. In addition, such electronic systems typically must operate in relatively confined or congested areas so that the space required for air cooling systems is not available or practical. In most urban areas, for example, the space required for a fan-operated air cooling system would be prohibitively expensive and such a system would required large unsightly containers to house the fans or other air conditioning units.

One means to cool electronic components during operation in a more confined area is to use a cold plate, which essentially is an enclosed container through which fluid coolant flows to cool electronic components in contact with the cold plate. A conventional cold plate is shown in FIG. 1, and includes a plurality of bosses 4, 6 upon which the electronic components are seated, and a fluid path 2 through which a liquid coolant or air flows around the bosses 4, 6. A fluid source 7 is typically coupled to the inlet 3 of the cold plate 1 for delivering liquid coolant or air to the cold plate 1, and a receptacle 9 is typically coupled to the outlet 5 for re-cooling and/or recycling the liquid coolant or air. As further shown in this figure, the fluid path 2 associated with the conventional cold plate 1 is sequential, so that the electronic component mounted at the first boss 4 is cooled, and then the electronic component mounted at the second boss 6 is cooled, and so on. The fin area 8 surrounding each boss 4, 6 absorbs the heat generated by the electronic components to be cooled.

Where the number or configuration of electronic components to be cooled necessitates the use of more than one cold plate, the cold plates can be disposed in a vertical stack. In such a system, a single liquid coolant or air source typically delivers the fluid through a manifold to the inlet of each cold plate. To ensure that the pressure and flow rate across each cold plate is about equal, the diameter of the orifice of the inlet is adjusted for each plate. The increasing diameters of the orifices of successive cold plates force the fluid to travel up the stack and through the successive cold plates. Obtaining the proper diameter of the inlet orifices is often difficult however, and typically requires extensive testing and frequent adjustment. As a result, the time and expense required to fabricate and maintain the cooling system is increased. In the absence of such adjustment, the fluid delivered from the source will typically enter the first cold plate in greater proportion before traveling to cold plates disposed above the first plate, resulting in fluid starvation at the top-most cold plate.

It is therefore an object of the present invention to provide a cold plate and system for cooling electronic elements that provides a substantially uniform pressure drop across each cold plate without adjusting the diameter of the inlet orifice to each plate.

Another object of the present invention is to provide a system with substantially uniform flow across each cold plate regardless of the location of the cold plate in the stacked system.

A further object of the invention is to provide a cold plate cooling system that cools electronic components and achieves a substantially isothermal surface.

It is still another object of the present invention to provide a cold plate cooling system that uses a minimum amount of coolant.

SUMMARY OF THE INVENTION

In one embodiment, the present invention provides a system for cooling electronic components comprising a cold plate having a channel through which a fluid coolant is transported, a plurality of bosses each for receiving an electronic component, and a plurality of fin structures, at least three of which are adjacently disposed in a sequential order on the cold plate. Each fin structure surrounds a boss, and has a fin inlet and a fin outlet in fluid communication with a section of the channel for supplying the area surrounding the boss with coolant. A portion of the channel defines a serpentine path for transporting the fluid coolant to the at least three sequential fin structures in non-sequential order. Sections of the channel in the serpentine path further transport the coolant in opposite directions, thus increasing heat transfer and providing a substantially uniform temperature at each boss across the cold plate.

In yet another embodiment, the present invention provides a system for cooling electronic components having a pair of serpentine paths disposed adjacent each other on opposed sides of the cold plate.

In still another embodiment, the present invention provides a system for cooling electronic components comprising a pump delivering fluid coolant to a manifold for delivering the coolant to the inlets of a plurality of cold plates disposed in a vertical stack, and a manifold for transporting coolant away from each cold plate. Each cold plate disposed in the vertical stack is coupled to each manifold by the same flow length, that is, each plate is coupled to each manifold through a tube of constant length. The pipe delivers coolant through the inlet and to a channel through which a fluid coolant is transported across the cold plate. Each cold plate has a plurality of bosses, each for receiving an electronic component, and a plurality of fin structures, at least three of which are adjacently disposed in a sequential order on the cold plate. Each fin structure surrounds a boss, and comprises a fin inlet and a fin outlet in fluid communication with a section of the channel. A portion of the channel disposed about the at least three fin structures provides a serpentine path such that coolant is delivered to the fin structures in a non-sequential order. The serpentine path and fin structures provide an input resistance to the coolant delivered by the manifold such that the each plate receives only a certain volume of coolant. Each cold plate in the stack thus has a substantially uniform flow rate and a substantially uniform pressure drop across the plate. The substantially uniform flow rate and pressure drop results in a cooler, substantially uniform temperature surrounding each boss and an isothermal surface across the region of the serpentine flow path.

In yet another embodiment, the at least three fin structures are sequentially disposed such that the first fin structure is disposed adjacent the second fin structure, and the second fin structure is disposed adjacent a third fin structure. The channel further transports the fluid coolant along a serpentine path from the first fin structure to the third fin structure and then to the second fin structure.

In still another embodiment, the channel further transports the fluid coolant from the third fin structure to other fin structures on the cold plate in a sequential manner.

In yet another embodiment of the present invention, a method of cooling electronic components includes providing a plurality of cold plates disposed in a stacked configuration, delivering fluid coolant to the channel in each of the cold plates via a manifold, and transporting fluid coolant through each channel such that the fluid coolant is delivered to the fin structures surrounding the bosses in a non-sequential order. The method of cooling causes the pressure drop and the flow rate of the fluid coolant to be substantially equivalent across each cold plate, resulting in a substantially uniform temperature existing around each boss, and an isothermal surface existing across at least a portion of the cold plate.

These and other objects of the invention will be made apparent from the description below and the claims.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

Figure 1:
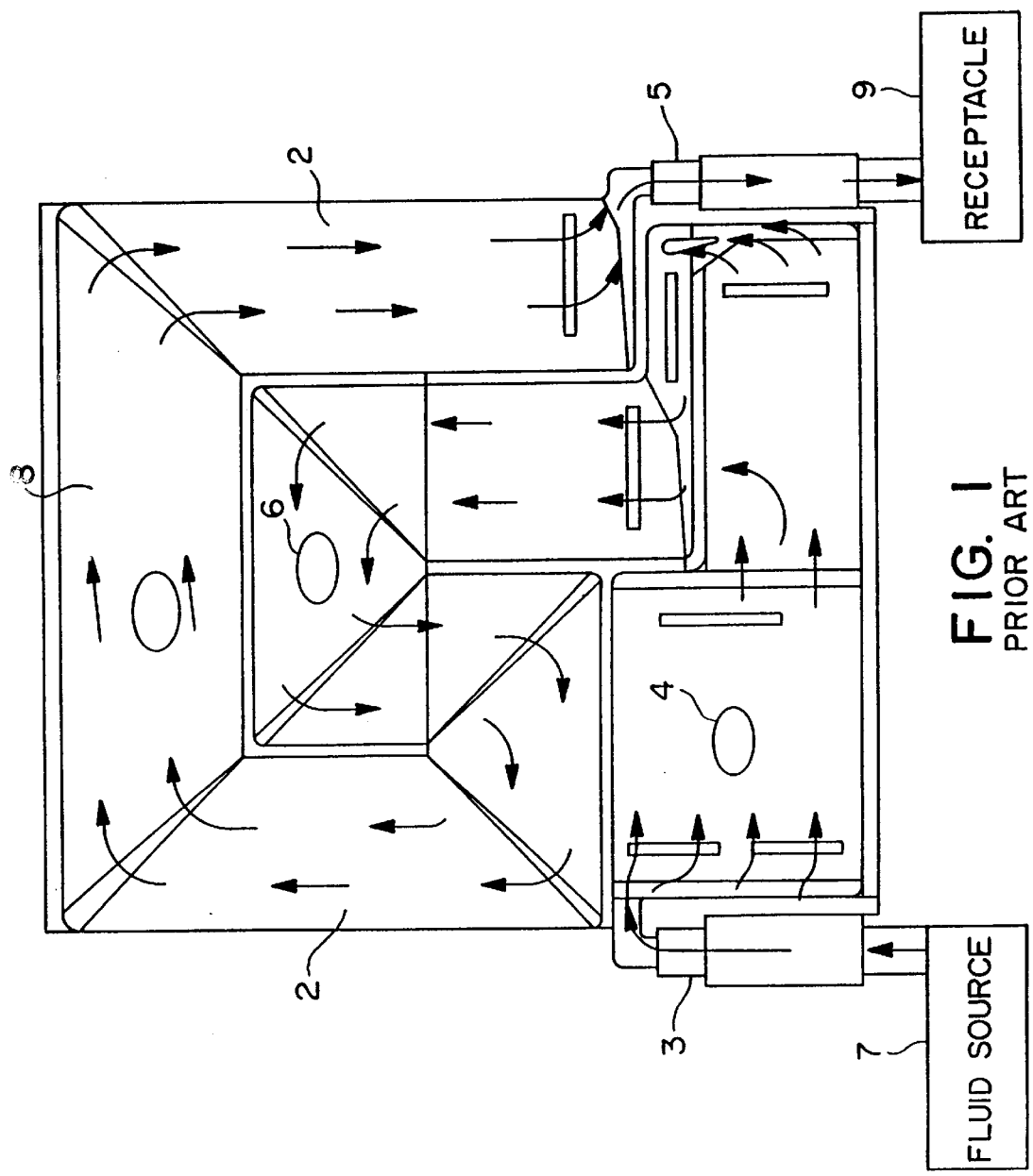
FIG. 1 is a top view of a prior art cold plate having a sequential flow path.
Figure 2:
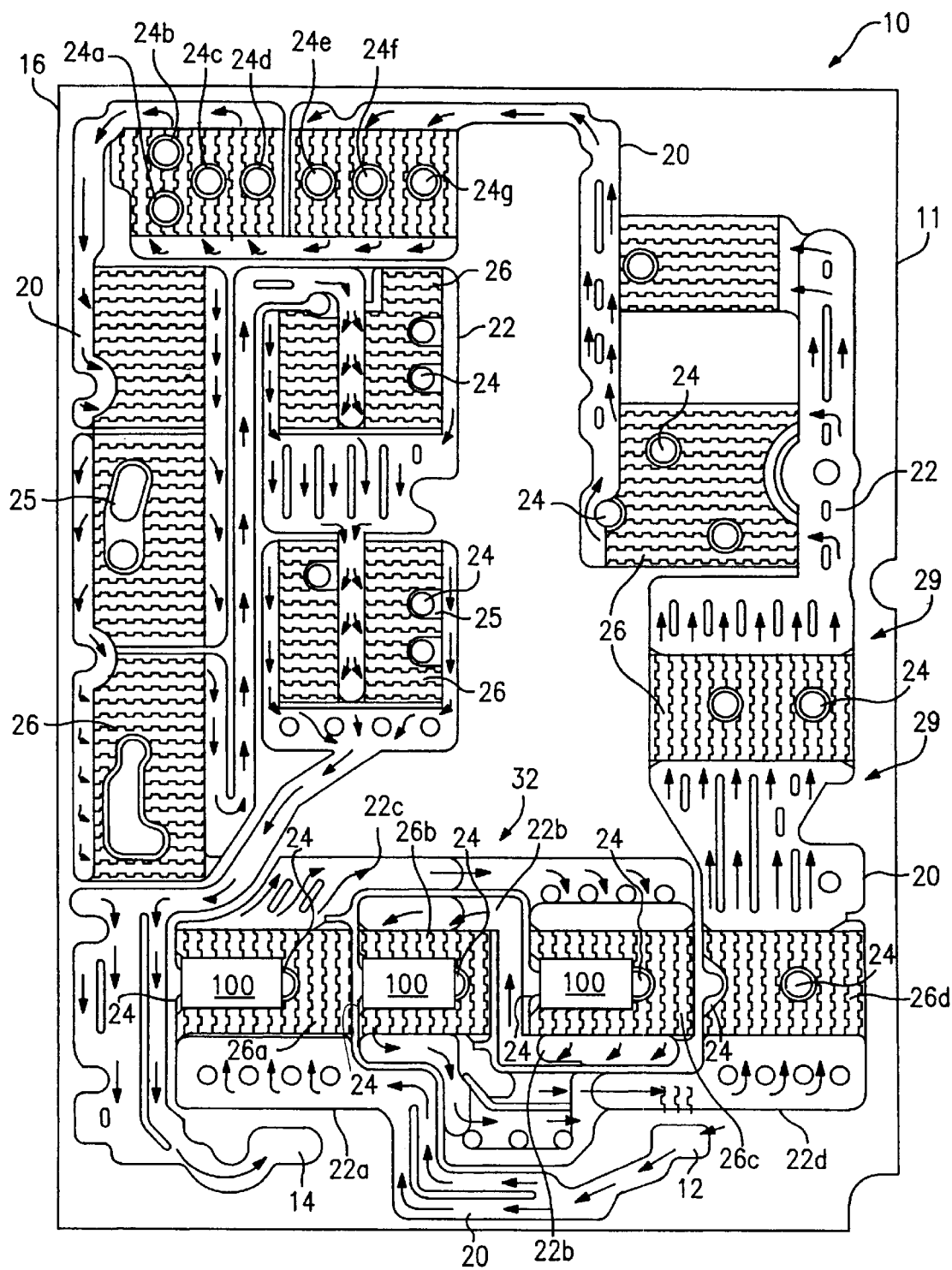
FIG. 2 is a top view of one embodiment of the cold plate of the present invention having a non-sequential flow path.

Referring to FIG. 2, shown is a top view of one embodiment of the cold plate of the present invention. The cold plate 10 has an inlet 12 for accepting fluid, typically a fluid coolant for cooling one or more heat-generating components 100. The fluid coolant can be air, liquid or gas, and in the present embodiment, the fluid coolant is preferably a liquid coolant such as ethylene glycol. Each cold plate further includes a fluid outlet 14 for discharging the fluid coolant to a receptacle (not shown) where the fluid can be recycled and/or re-cooled. The cold plate 10 typically can have a thickness in the range of about 0.12 inch to about 1 inch, or and is comprised of a base plate 11 and a cover plate (not shown). The thickness of the cold plate 10 is typically greater for commercial applications than for military applications. For example, where a cold plate is used to cool components used in military aviation, the cold plate 10 is typically thinner (i.e. 0.12 inch) due to the increased importance of weight and size in aviation applications.

Extending between the fluid inlet 12 and the fluid outlet 14 is a fluid channel 20. The fluid channel 20 can be a tube or similar fluid passageway of any arbitrary shape through which fluid travels, and may be formed by walls machined or otherwise formed in the base plate 11. Also formed in the base plate 11 are one or more bosses 24, each of which receives or contacts a component such as an electronic, optical or other heat generating component 100 to be cooled. For purposes of illustration only, the components 100 will be referred to as electronic components. In the present embodiment, the bosses 24 can be solid circular protrusions formed in the base plate 11, and are generally disposed along the plate 10 at locations defined by the user's specifications. For instance, in the cold plate of FIG. 2, a plurality of electronic components reside in close proximity to each other at the back-end 16 of the plate 10, as shown by bosses 24a, 24b, 24c, 24d, 24e, 24f, and 24g. The electronic components 100 can be secured to each boss 24 by drilling and tapping the boss 24 and providing a screw or other fastening member (not shown) through the component 100. In other embodiments, the bosses 24 can simply be locations on the base plate 11 upon which a component 100 resides.

Figure 3:
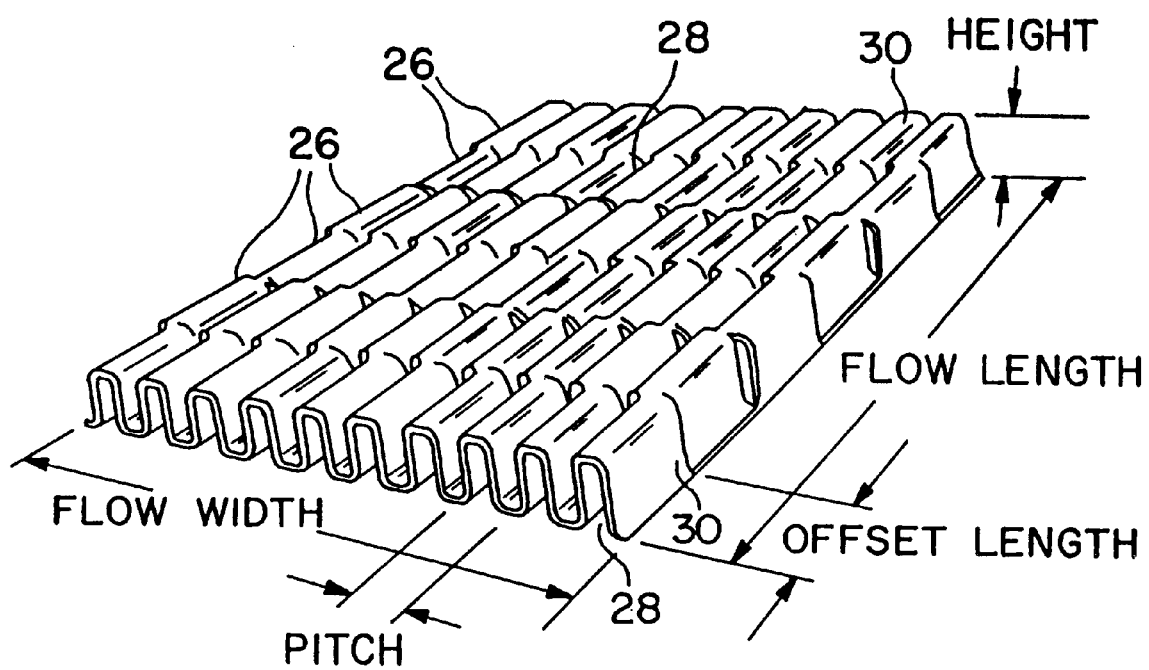
FIG. 3 is a plan view of the fin structure used in the cold plate of FIG. 2.

Disposed around or in contact with the bosses 24 are a plurality of fin structures 26, which preferably comprise corrugated aluminum fin stock of the type typically used to control heat transfer and fluid distribution. Each fin structure 26 is disposed such that it is in fluid communication with a section of the channel 22. Referring briefly to FIG. 3, each fin structure 26 has a fluid inlet 28 and a fluid outlet 30 for receiving fluid from the channel (not shown) and delivering fluid to flow around the bosses (not shown). Although not shown, in other embodiments, a single fin structure having a plurality of fluid inlets and fluid outlets can be used.

As shown in FIG. 3, differing characteristics of the fin structures 26 can be modified to achieve a desired flow rate across each cold plate. Such parameters include: the fin pitch, that, is the number of fins per inch; the fin offset or interruptive length; the flow length, that is, the aggregate of the fin offset or interruptive length; the fin height; and the flow width, that is, the combined width of the fin structures in a row, and the fin thickness. These parameters can each be modified independently to achieve a desired flow rate and pressure drop, as will be further described below.

Referring again to FIG. 2, each fin structure 26 is disposed around a boss 24 and receives fluid from the channel 20. The fluid travels through the channel 20 and into the fin structures 26, which directs the fluid around the perimeter 25 of the bosses 24 to cool the electronic components 100 seated on the bosses 24. A portion of the fluid channel 20 forms a serpentine path 32 around three or more adjacently disposed fin structures 26. The serpentine path 32 can be located anywhere on the cold plate 10, although in the embodiment of FIG. 2, the serpentine path 32 is located near the inlet 12 of the cold plate 10. The serpentine path 32 can be most advantageously used to cool the hottest, most sensitive electronic components 100, as it provides more uniform cooling than do conventional cold plate designs. The serpentine path 32 therefore avoids the problem where similar electronic components such as computer chips are unevenly cooled and then operate at different temperatures, causing imbalance and failure of the electronic system being cooled.

The serpentine path 32 provides non-sequential flow about the bosses 24, as the fluid channel sections 22a, 22b, 22c, 22d that comprise the serpentine path 32 deliver fluid to adjacently disposed fin structures 26a, 26b, 26c, 26d in an order that does not follow the sequential order in which the fin structures 26a, 26b, 26c, 26d are disposed. The directions of the arrows in the fluid channel sections 22a, 22b, 22c, and 22d further demonstrate the path of the fluid delivered by the serpentine path 32. Starting with the inlet 12 to the channel 20, note that the channel 20 first delivers the fluid to channel section 22a and through fin structure 26a, and then onward to channel section 22c. Channel section 22c then delivers fluid into fin structure 26c, and onward to channel section 22b. Channel section 22b then delivers fluid through fin structure 26b and onward to channel section 22d. Channel section 22d then delivers fluid to fin structure 26d. The serpentine path 32 is therefore non-sequential, as fluid is not delivered in sequential order from fin structure 26a, to 26b, to 26c, and then to 26d. From fin structure 26d, the channel 20 can take on a sequential path 29 as shown, or continue to follow a non-sequential path.

Figure 4:
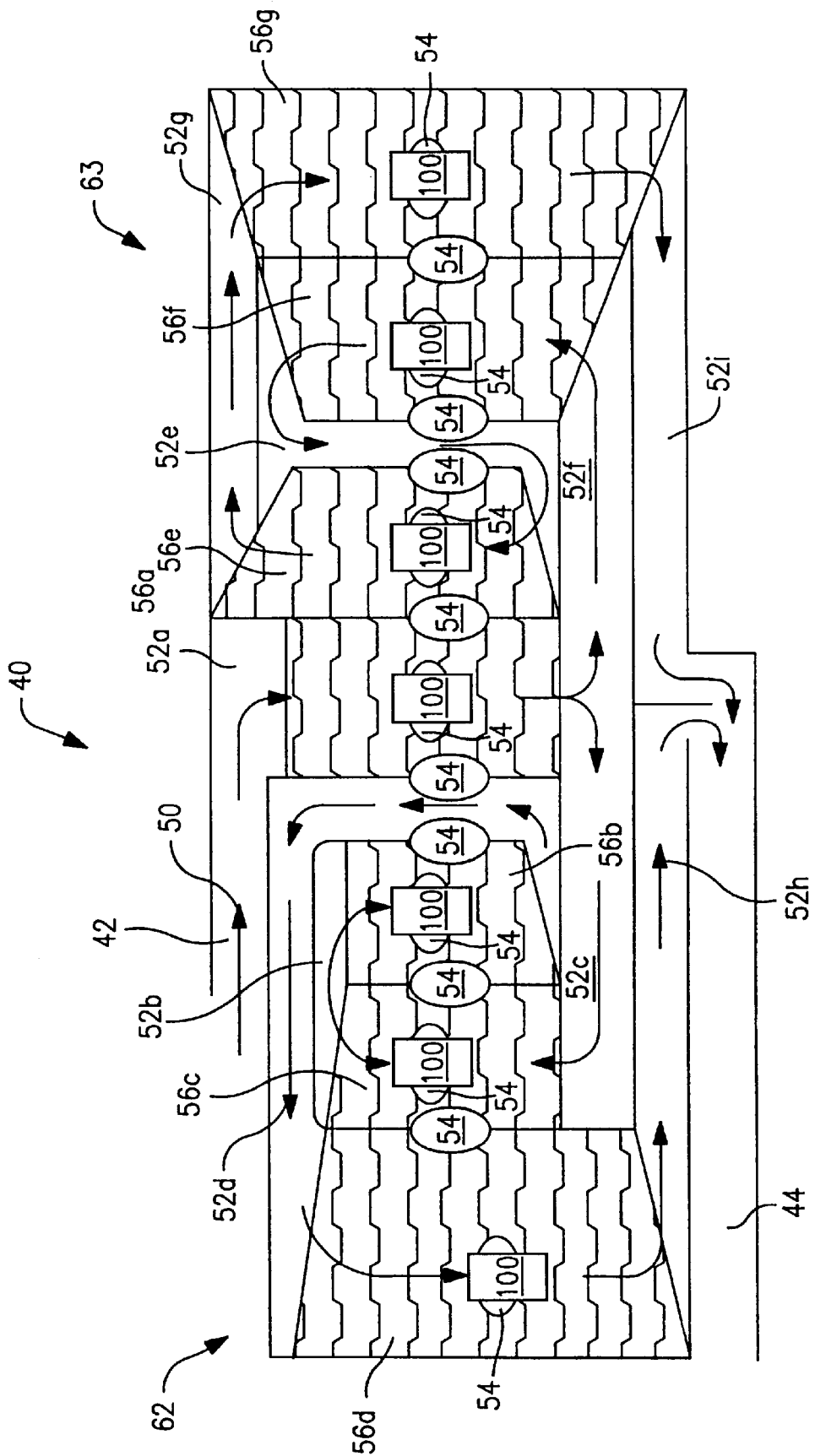
FIG. 4 shows a top view of another embodiment of the cold plate of the present invention having a non-sequential flow path.

Note that the direction in which fluid is transported in channel section 22c is opposite the direction in which fluid is transported in channel section 22b. The counterflow fluid paths in channel sections 22c, 22b of the present invention provide effective heat transfer, which in turn, equalizes the temperature in each channel section 22c, 22b, as well as other channel sections. In a conventional cold plate, flow typically proceeds sequentially without counterflow, which allows fluid further from the cold plate inlet (which is therefore warmer), to be cooled by the adjacent counterflow fluid closer to the cold plate inlet (which is therefore cooler). Such opposing fluid paths further provide substantially uniform cooling of the electronic components 100 in the bosses 24 disposed within the fin structures 26a, 26b, 26c, 26d, as well as the bosses 24 disposed throughout the cold plate 10. This temperature equalization and uniformity in cooling will be further shown in the temperature plot of FIG. 7.

Where a longer serpentine path is desired, that is, where the number of electronic components 100 to be cooled to a certain degree are greater than, for example four components 100, as shown in FIG. 2, or where a high input pressure is desired, a plurality of serpentine paths surrounding four or less components can be used. Referring to FIG. 4, shown is a top view of another embodiment of the cold plate 40 present invention employing a pair of serpentine paths 62, 63. As similarly described above, the cold plate 40 includes a fluid inlet 42 for accepting fluid, a fluid outlet 44 for discharging the liquid coolant, and a fluid channel 50 defined in the plate between the fluid inlet 42 and the fluid outlet 44. Formed in the plate 40 are one or more bosses 54, each of which receives an electronic component 100 to be cooled, and a plurality of fin structures 56a, 56b, 56c, 56d, 56e, 56f, 56g, each of which is disposed in fluid communication with one or more sections of the channel 50. As described above, each of the plurality of fin structures 56a, 56b, 56c, 56d, 56e, 56f, 56g surrounds a boss 54.

As further shown in this figure, the fluid channel 50 forms a pair of parallel serpentine paths 62 and 63. Serpentine path 62 is defined by the channel sections 52b, 52c, and 52d, which are in fluid communication with three adjacently disposed fin structures 56b, 56c, and 56d. Serpentine path 63 is defined by the channel sections 52e, 52f, 52g, which are in fluid communication with three adjacently disposed fin structures 56e, 56f, 56g. As described above in FIG. 2, each serpentine path 62, 63 is non-sequential, as the fluid channel sections 52b, 52c, 52d, 52e, 52f and 52g deliver fluid to adjacently disposed fin structures 56b, 56c, 56d, 56e, 56f, 56g in an order that does not follow the sequential placement of such fin structures 56b, 56c, 56d, 56e, 56f, 56g.

The directions of the arrows in the fluid channel sections 52a, 52b, 52c, 52d, 52c, 52f and 52g further demonstrate the path of the fluid delivered by each serpentine path 62, 63. Starting with the inlet 42 to the channel 50, the channel 40 first delivers the fluid to channel section 52a, and through fin structure 56a, and then splits into channel sections 52c and 52f. Channel section 52c then delivers fluid into fin structure 56c, and channel section 52f delivers fluid into fin structure 56f. From fin structure 56c, fluid is delivered to channel section 52b and through fin structure 56b. From fin structure 56f, fluid is delivered to channel section 52e and through fin structure 56e. From fin structure 56b, fluid is delivered to channel section 52d and through fin structure 56d. From fin structure 56e fluid is delivered to channel section 52g and through fin structure 56g. From fin structures 56d and 56g, the fluid travels through channel sections 52h and 52i and combine at outlet 44. Although not shown in this figure, channel sections 52h and 52i can be joined with other channel sections as shown in FIG. 2, which flow to other fin structures in a sequential or non-sequential manner. The pair of serpentine paths shown in FIG. 4 aid in achieving a cold plate of compact design, as the number of contiguous channel sections such as 52b, 52d, and 52e, 52g, are reduced.

Figure 5:
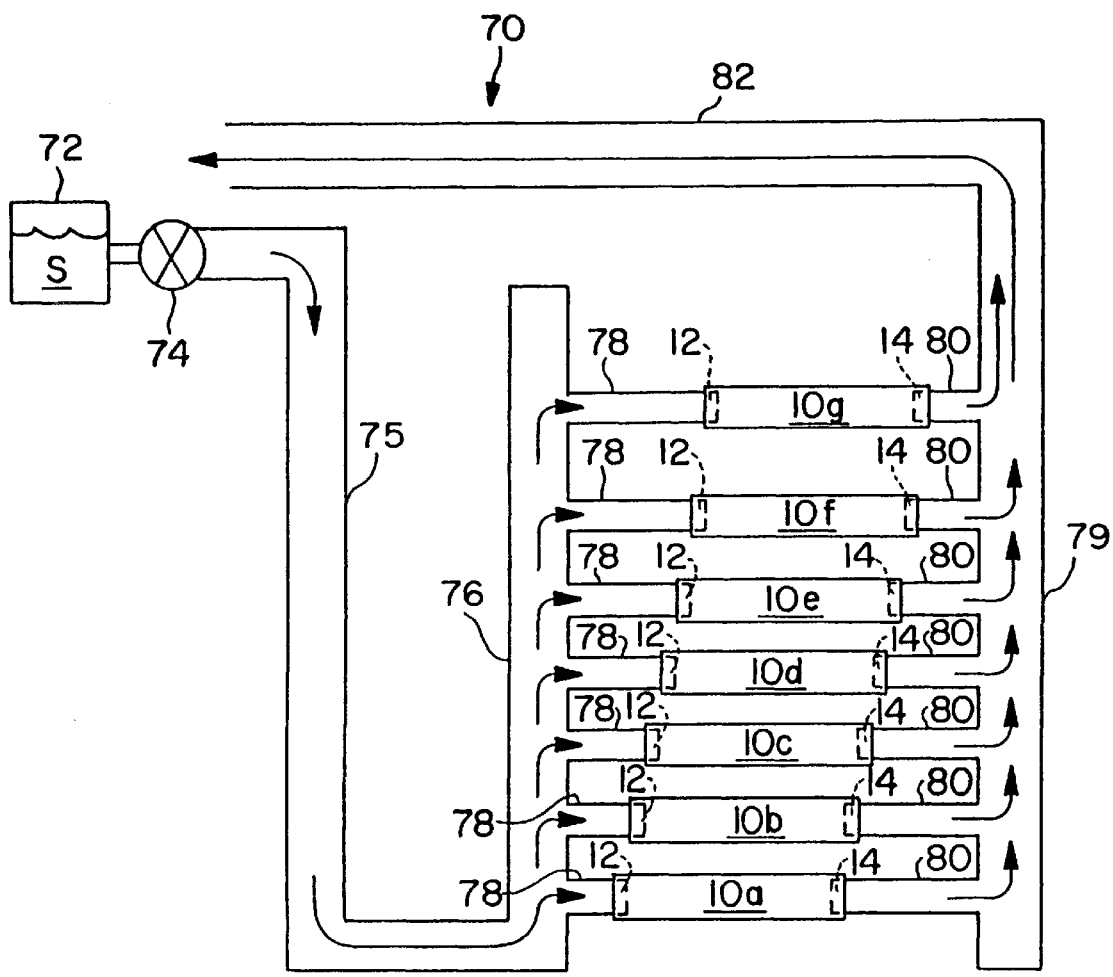
FIG. 5 is a side view of a cooling system of the present invention having a plurality of cold plates disposed in a vertical stack.

The cold plate of the present invention may be used in a system for cooling multiple levels of racks of electronic components. Referring to FIG. 5, shown is a plan view of one embodiment of a cooling system 70 according to the present invention. The cooling system 70 comprises a plurality of cold plates 10a–10g disposed in a vertical stack. For purposes of discussion only, the cold plates 10a–10g are similar to the cold plates 10, 40 described in the embodiments of FIG. 2 and FIG. 4. However, it is important to note that the cold plates 10a–10g can have any channel and fin structure desirable to the user, provided that each cold plate 10a–10g has a channel that defines at least one serpentine path for delivering fluid non-sequentially to at least three adjacently disposed fin structures. A fluid source 72 is coupled to a pump 74 for pumping fluid to a manifold 76. The manifold 76 is fluidity coupled to an identical orifice 13 in each cold plate 10.

As shown in this figure, each cold plate 10a–10g has an identical orifice 13 at its inlet. The diameter of the orifice 13 on each cold plate 10a–10g is substantially the same, and such uniformity in diameter does not cause the flow rate or the pressure drop to vary with each plate in the vertical stack, as would result with the use of uniform diameters in a conventional system. Each cold plate 10a–10g has an outlet through which fluid flows and joins other fluid traveling to a re-cooling and/or recycling device (not shown). It is important to note that the length of pipe 78 from the manifold to each cold plate 10a–10g is substantially equivalent, and that the length of pipe 80 emanating from the outlet of each cold plate 10a–10g to the outlet manifold 79 is substantially equivalent. Additionally, the length of pipe 78 can be substantially equivalent to the length of pipe 80. In another embodiment, the length of pipe 75 that leads from the pump 74 to the manifold 76, can be substantially equivalent to the length of pipe 82 that travels to a re-cooling or re-cycling unit (not shown). The use of equivalent length pipes allows the frictional losses associated with fluid flow to and from each cold plate to be substantially equivalent. As such, frictional losses can be equally accounted for when creating a substantially uniform pressure drop and flow rate across each plate 10a–10g.

In operation, the pump 74 is activated and delivers fluid from the fluid source 72 to the manifold 76. The manifold 76 delivers fluid through the orifice 13 in each cold plate 10a–10g. When the fluid is delivered, it is evenly distributed to each cold plate 10a–10g because the serpentine structure on each cold plate 10a–10g provides a high input resistance, preventing fluid from flowing in greater volume into the lower cold plates 10a, 10b, etc. As a result, the flow rate and pressure drop are substantially uniform across each cold plate 10a–10g, and the electronic components (not shown) located in the area of the serpentine flow path are cooled to a substantially uniform operating temperature.

Generally, as fluid is delivered to the cold plates 10a–10g, a large volume of the fluid would typically try to flow into the lower-most cold plate 10a. In other words, the fluid desires to take the path of least resistance, and by traveling into the first plate, the fluid avoids the pull of gravity and the frictional forces associated with traveling upward to higher cold plates 10b–10g. Referring again to FIG. 2, the serpentine path 32 and the fin structures 26a–26d, disposed adjacent the serpentine path 32 in each cold plate 10a–10g, create the high input resistance in each plate 10a–10g, as the fluid in the channel 20 must travel through a number of bends and fins structures 26a–26d and undergo associated pressure losses before traveling across the length of the cold plate 10. Such a high input resistance allows only a certain amount of fluid at a certain flow rate to flow into cold plate 10a, with the remainder of the fluid flowing evenly to successive cold plates 10b–10g in the stack. The additional fin structures 26 located on each cold plate 10a–10g can further increase the resistance across the plate. Therefore, each cold plate 10a–10g acts like a self-limiting device, as each cold plate 10a–10g accepts only a certain amount of flow, thus providing a sufficient volume of fluid at a sufficient flow rate to even the top-most cold plate 10g.

In a vertical stack of cold plates having a conventional design, there would be pressure inequalities at the inlet of each cold plate, because gravitational and frictional effects cause the flow rate at each cold plate to differ. The inlet of the lower-most cold plate 10a would typically have the highest inlet pressure and the highest flow rate, while the inlet of the top-most cold plate 10g would have the lowest inlet pressure and the lowest flow rate. At the output side, these parameters would be reversed, that is, the flow rate at the lower-most cold plate 10a would be the lowest and the outlet pressure would be the lowest, while the top-most cold plate 10g would have the highest outlet pressure and the highest flow rate. As a result, the flow rate and pressure drop across each plate would vary absent expensive and time-consuming installation and testing of customized orifices for each inlet in the cold plates 10a–10g. However, the present invention as described in FIG. 2 and FIG. 4 creates a cold plate 10, 40 that by design, only accepts a certain amount of fluid without the need for customized orifice testing and installation.

The cold plates 10, 40 of the present invention can be designed to meet a user's needs first by determining the number of cold plates desired by the user, and the number of watts of power per cold plate. The watts of power conveys the amount of heat that must be dissipated. From this determination, the flow rate required to dissipate the heat on each cold plate can be determined. By multiplying the flow rate per cold plate by the number of cold plates desired, the total flow rate can be calculated. With knowledge of the total flow rate one can select a pump that would likely deliver this flow rate, and determine the desired input pressure required by the system, that is the pressure at which the pump must be able to deliver the fluid.

Figure 6:
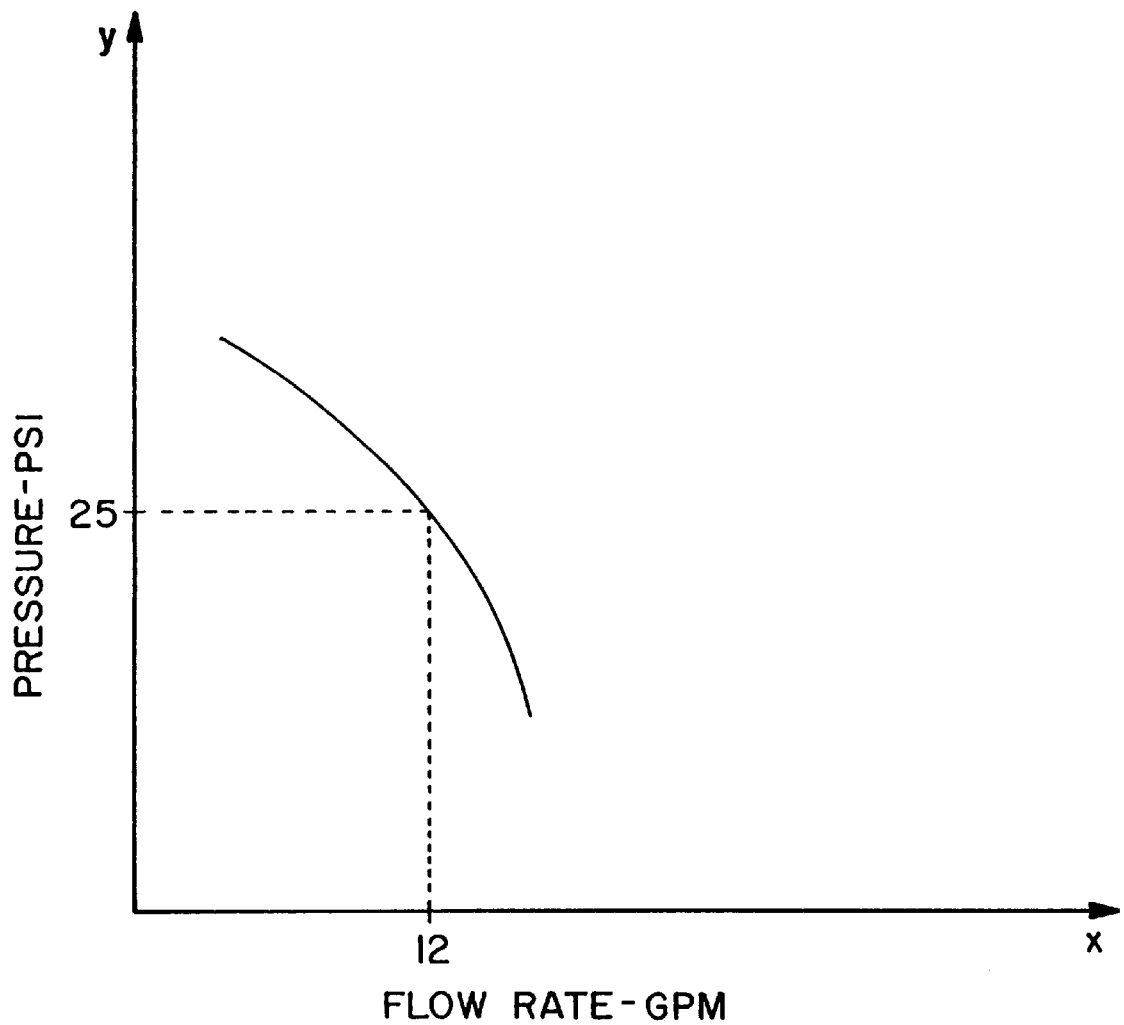
FIG. 6 is a graph showing a desired operating point of the system of the present invention.

Referring to the graph of FIG. 6, the required pressure can be determined by plotting the desired total flow rate Q on the pressure curve of the selected pump. This graph demonstrates that the flow rate of the pump is typically inversely proportional to the pressure. The total flow rate of the pump appears on the x-axis, and the pump pressure appears on the y-axis. Determining the point on the curve where the total flow rate meets the pump curve, one can obtain the desired pump pressure. This point on the operating curve is the desired operating point for the system. The operating point represents the pump pressure that the system requires. As further described, knowledge of the operating point further allows one to determine the desired pressure differential that must exist across each plate.

The operating point OP of the system can be described as the pressure drop $\Delta P_i$, which is the pressure drop for each plate (i representing a cold plate from 1 to n), including changes in pressure introduced by other effects. This is shown mathematically as:

$$OP = \Delta P_i$$

The pressure drop $\Delta P_i$ takes into account the pressure drop across the cold plate as well as the changes in pressure that occur in response to gravitational losses, frictional losses associated with pipes delivering fluid to and from the cold plates, losses due to bends in such pipes, losses introduced by the cooling system, and losses introduced by changes in the cross-sectional area of different flow channels. The pressure drop $\Delta P_i$ can thus be represented mathematically as:

$$\Delta P_i = \Delta P_{cold\ plate} + \Delta P_{gravity} + \Delta P_{pipe\ friction} + \Delta P_{pipe\ bends} + \Delta P_{cooling\ system} + \Delta P_{cross\ section}.$$

As such effects of gravity, friction, bends, the cooling system, and changes in the cross section of the flow channel are known or easily obtained, this equation can be solved for $\Delta P_{cold\ plate}$ to determine the pressure drop that must exist across each cold plate. Note that additional pressure losses may be sustained that contribute to the pressure drop $\Delta P_i$.

As the pressure drop across a cold plate $\Delta P_{cold\ plate}$ can be attributed to changes in pressure that occur in response to fin structure losses, frictional losses existing on the plate, and losses due to the bends in the channel on each plate, the value of $\Delta P_{cold\ plate}$ can be used to design such features of the cold plate. The pressure drop across each cold plate $\Delta P_{cold\ plate}$ can be represented mathematically as:

$$\Delta P_{cold\ plate} = \Delta P_{fin\ structure} + \Delta P_{plate\ friction} + \Delta P_{plate\ bends}$$

Given this relationship, the desired pressure drop across each cold plate can be used to facilitate the design of fin structures and channel bends on the cold plate, as will be further described.

Still referring to FIG. 6, assuming for purposes of example only that the desired total flow rate is 12 GPM (i.e. 12 cold plates, 1 GPM per cold plate), a determination of $\Delta P_i$ can be obtained by extending a line up from the flow rate to the operating curve. The corresponding pressure value, shown for example, in this figure as 25 PSI is the minimum pressure that the pump can have to supply the system pressure drop $\Delta P_i$. Therefore, the selected pump must be able to deliver fluid to the system at a pressure, $\Delta P_{i\ minimum}$ of 25 PSI. One can then check the specification of the selected pump to ensure that the pump can deliver the fluid at the desired pressure. If the pressure of the pump is less than $\Delta P_{i\ minimum}$, then the pump cannot be used, and a pump having differing output characteristics should be selected. This process is repeated until an appropriate pump is selected.

The serpentine path described above, along with modifications made to the parameters of the fin structures can be used to create a desired pressure drop across each plate. For example, to achieve a desired pressure drop, the bends in the channel can be modified by length and angle, and the parameters described in FIG. 3 that relate to the fin structure can be modified. For example, the fin height, flow length, offset or interruptive length, fin pitch, fin thickness and cross-section of the flow channel can be modeled to achieve the desired pressure drop. It is important to note that such modifications will result in an substantially equal pressure drop $\Delta P_{cold\ plate}$ across each cold plate, however, the inlet pressure and the outlet pressure of each cold plate may vary.

With the flow rate and pressure drop of the fluid being substantially equivalent across each cold plate 10a–10g as a result of the serpentine path 32 and fin structure 26, the cooling system 70 becomes a self-regulating system, notwithstanding the number of plates 10a–10g stacked in the system nor the diameter of the orifices 13 of each plate 10a–10g. Additionally, the size of the pump 74 used to deliver fluid to the manifold 76 can be significantly reduced.

Figure 7:
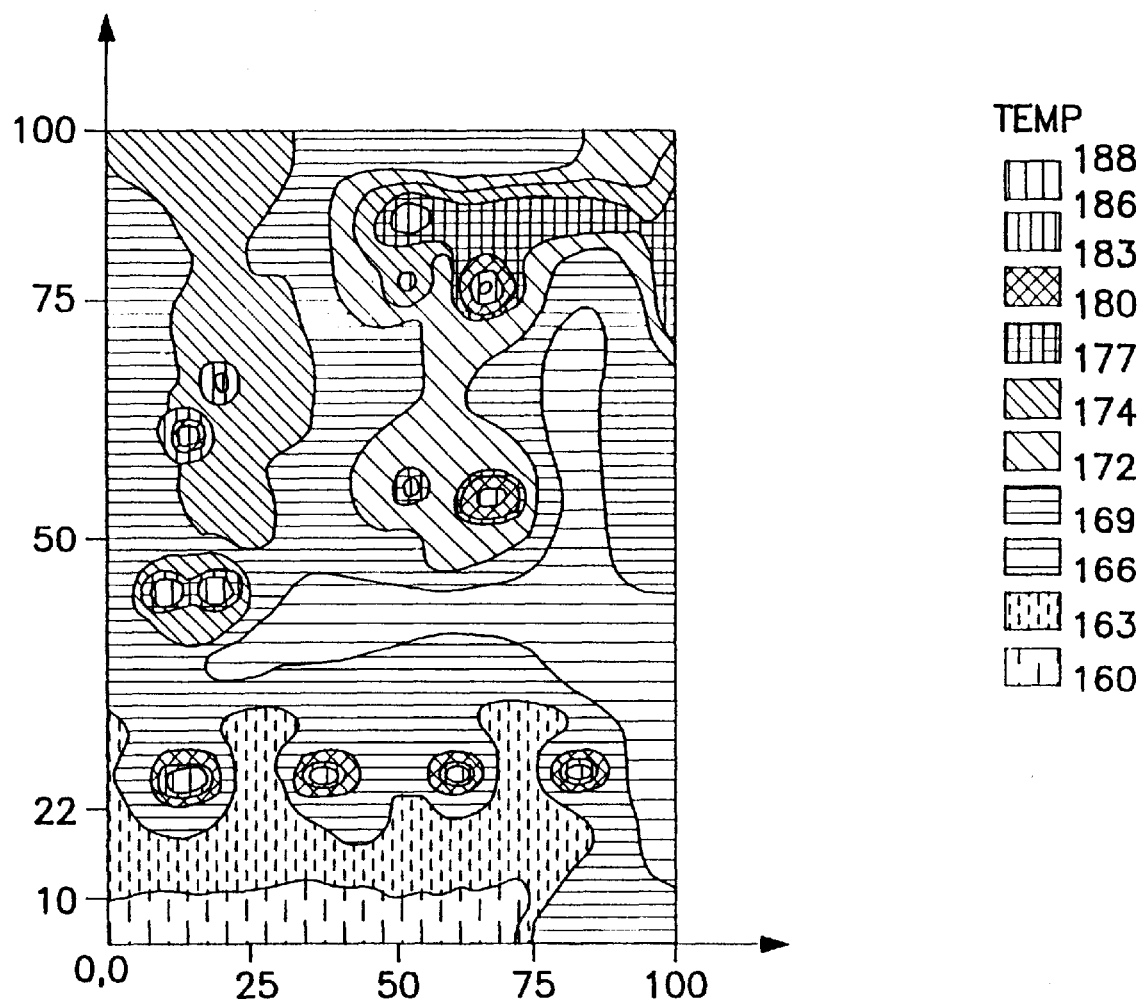
FIG. 7 is a plot showing temperature distribution across an embodiment of the cold plate of the present invention.

Referring to FIG. 7, shown is a temperature plot depicting the variation in temperature across an embodiment of the cold plate of the present invention. As shown on the temperature table on the right-hand side of the graph, the white and the striped portions of the graph represent the hottest portions of the cold plate (about 188° F.), while the dotted portions of the graph represent the coolest portions (about 160° F.). Grid coordinate 75,10 represents the inlet of the cold plate while grid coordinate 25,10 represents the outlet of the cold plate.

Referring to coordinates 10, 22 through 80, 22, note that these coordinates correspond to the channel sections 22a, 22b, 22c, and 22d of the serpentine structure of FIG. 2. These channel sections, particularly opposing channel sections 22c, 22b improve heat transfer and create a substantially isothermal surface across the path of the serpentine structure. This is evidenced by the temperature in this area, which is about 160° F., notwithstanding the nearby presence of four electronic components. It is further important to note, that although the above noted coordinates (0,22 through 75, 22) that correspond to the channel sections defining the serpentine structure can be slightly cooler than the outlet of the cold plate (coordinate 100, 100), the temperature plot shows substantially identical temperatures existing about each boss, shown in white. Referring to the temperature table, it is evident that the temperature is about 169° F. in the area around each boss.

Thus, the system of the present invention provides substantially uniform cooling of electronic components seated at the bosses on the cooling plate. Such cooling is achieved by the substantially equivalent flow rate and pressure drop across each plate, resulting from the use of a serpentine path and associated fin structures. The present invention improves the reliability of the electronic components being cooled, which operate more efficiently when cooled to lower and more uniform temperatures.

Variations, modifications, and other implementations of what is described will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A system for cooling at least one heat-generating component comprising:
   a cold plate having channel sections defining a channel through which a fluid coolant is transported, and having a plurality of bosses each for receiving the heat-generating component;
   at least three fin structures adjacently disposed in a sequential order on the cold plate, each fin structure contacting a boss, and comprising a fin inlet and a fin outlet in fluid communication with a section of the channel, the channel transporting the fluid coolant to the fin structures in non-sequential order; and
   a first channel section in fluid communication with a first fin structure and disposed adjacent a second channel section in fluid communication with a second fin structure, the first channel section transporting the fluid coolant in a first direction, and the second channel section transporting the fluid coolant in a direction opposite the first direction;
   whereby the fluid coolant flowing in the second channel section counterflows against the fluid coolant flowing in the first channel section, thereby transferring heat from the fluid coolant in the second channel section to the fluid coolant in the first channel section.

2. The system according to claim 1, wherein each boss is structured to receive an electronic component as the heat generating component.

3. The system according to claim 1, wherein each boss is disposed adjacent the channel.

4. The system according to claim 1, wherein the fin structures adjacently disposed in sequential order, are arranged in alignment.

5. The system according to claim 1, further comprising a manifold delivering the fluid coolant to the cold plate.

6. The system according to claim 1, the channel further defining a serpentine path.

7. The system according to claim 1, wherein the fin structures are sequentially disposed such that the first fin structure is disposed adjacent the second fin structure, and the second fin structure is disposed adjacent a third fin structure.

8. The system according to claim 7, wherein the channel further transports the fluid coolant from the first fin structure to the third fin structure and then to the second fin structure.

9. A system for cooling at least one heat-generating components comprising:
   a manifold for delivering a fluid coolant;
   a plurality of cold plates disposed in a vertical stack, each cold plate having channel sections defining a channel through which a fluid coolant is received from the manifold and transported, and having a plurality of bosses each for receiving a heat-generating component and being disposed adjacent the channel;
   at least three fin structures adjacently disposed in a sequential order on each cold plate, each fin structure surrounding a boss and comprising a fin inlet and a fin outlet in fluid communication with a section of the channel, the channel transporting the fluid coolant to the fin structures in non-sequential order; and
   a first channel section in fluid communication with a first fin structure and disposed adjacent a second channel section in fluid communication with a second fin structure, the first channel section transporting coolant in a first direction, and the second channel section transporting coolant in a direction opposite the first direction;
   whereby the fluid coolant flowing in the second channel section counterflows against the fluid coolant flowing in the first channel section, thereby transferring heat from the fluid coolant in the second channel section to the fluid coolant in the first channel section.

10. The system according to claim 9, each of the cold plates further comprising a fluid inlet having an orifice, wherein the diameter of each orifice is a substantially equivalent.

11. The system according to claim 9, wherein the channel defines a serpentine path.

12. The system according to claim 9, wherein the fin structures are sequentially disposed such that the first fin structure is disposed adjacent the second fin structure, and the second fin structure is disposed adjacent a third fin structure.

13. The system according to claim 12, wherein the channel further transports the fluid coolant from the first fin structure to the third fin structure and then to the second fin structure.

14. The system according to claim 13, wherein the flow rate of the fluid coolant delivered by the manifold to the plurality of cold plates is substantially equivalent across each cold plate.

15. The system according to claim 14, wherein a pressure drop across each cold plate is substantially equivalent.

16. A method of cooling at least one heat-generating component, comprising:

providing a plurality of cold plates disposed in a stacked configuration, each cold plate defining a channel through which a fluid coolant is received and transported, a plurality of bosses each for receiving a heat-generating component, each boss being disposed adjacent the channel, at least three fin structures adjacently disposed in a sequential order on the cold plate, each fin structure surrounding a boss and having a fin inlet and a fin outlet in fluid communication with the channel, and a first channel section in fluid communication with a first fin structure and disposed adjacent a second channel section in fluid communication with a second fin structure;

delivering fluid coolant to the channel in each of the cold plates via a manifold;

transporting fluid coolant through the first channel section in each cold plate in a first direction;

transporting fluid coolant through the second channel section in each cold plate in a direction opposite the first direction, whereby the fluid coolant flowing in the second channel section counterflows against the fluid coolant flowing in the first channel section, thereby transferring heat from the fluid coolant in the second channel section to the fluid coolant in the first channel section; and transporting fluid coolant through each channel of each cold plate such that the fluid coolant is delivered to the fin structures of each cold plate in a non-sequential order, causing the flow rate of the fluid coolant to be substantially equivalent across each cold plate.

17. The method of cooling according to claim 16, wherein the pressure drop across each cold plate is substantially equivalent.

18. The method of cooling according to claim 16, wherein the fluid coolant flows through the channel in a serpentine path.

19. The method of cooling according to claim 16 wherein the fin structures are sequentially disposed on each cold plate such that the first fin structure is disposed adjacent the second fin structure, and the second fin structure is disposed adjacent a third fin structure; and wherein the method further comprises the step of:

delivering the fluid coolant in a non-sequential manner through the channel such that the fluid coolant is transported to the first fin structure, and then to the third fin structure, and then back to the second fin structure.

20. The method of cooling according to claim 19, further comprising:

delivering the fluid coolant from the third fin structure to any of the other fin structures in a sequential manner.

* * * * *